United States Patent [19]
Steffes et al.

[11] Patent Number: 5,338,214
[45] Date of Patent: Aug. 16, 1994

[54] EXPANSION CARD/RISER CARD MODULE FOR DESKTOP COMPUTERS

[76] Inventors: Karl M. Steffes, 7302 Kapok La., Austin, Tex. 78759; Joseph B. Crosby, 4030 Westlake Dr., Austin, Tex. 78746; Jerry D. Gandre, 7408 Curly Leaf Cove, Austin, Tex. 78750; Dan E. Swindler, 2404 Messick Loop W., Round Rock, Tex. 78681

[21] Appl. No.: 967,903
[22] Filed: Oct. 27, 1992
[51] Int. Cl.5 ............................................. H05K 1/14
[52] U.S. Cl. .................... 439/160; 361/683; 361/798; 439/928
[58] Field of Search ............ 439/59, 61, 64, 159, 439/160, 928; 361/384, 392, 395, 399, 413, 415, 424, 683, 798, 754

[56] References Cited

U.S. PATENT DOCUMENTS

| | | | |
|---|---|---|---|
| 4,894,753 | 1/1990 | Wadell et al. | 361/413 |
| 4,899,254 | 2/1990 | Ferchau et al. | 361/384 |
| 4,901,205 | 2/1990 | Landis et al. | 361/413 |
| 4,979,075 | 12/1990 | Murphy | 29/830 |
| 5,136,468 | 8/1992 | Wong et al. | 439/61 |
| 5,174,762 | 12/1992 | Hoppal et al. | 439/61 |

*Primary Examiner*—Neil Abrams
*Attorney, Agent, or Firm*—James W. Huffman; Rick Konneker

[57] ABSTRACT

A desktop computer is provided with an expansion card/riser card module which includes a housing within which a riser card and a plurality of associated expansion cards are removably supported and electrically coupled to one another. The module, and thus the riser and expansion cards it carries, may be quickly and operatively coupled to the computer motherboard simply by pushing the module housing downwardly onto the board in a manner matingly inserting a connection edge portion of the housing-supported riser card into a corresponding motherboard connection socket. The module may be quickly removed from the motherboard simply by pulling upwardly on the module to disconnect the riser card from the motherboard socket. In an alternate embodiment of the module, this disconnection is facilitated by a leveraged removal latch structure carried by the module housing and forcibly engageable with the motherboard to lift the module upwardly therefrom. A variety of other useful features are incorporated in the module including a cooling fan removably mounted thereon, a built-in grounding connection for the riser card, and the provision by the module housing of support for a monitor mounted atop the computer housing.

24 Claims, 9 Drawing Sheets

EXPANSION CARD/RISER CARD MODULE FOR DESKTOP COMPUTERS

BACKGROUND OF THE INVENTION

The present invention relates generally to the fabrication of computers and, in a preferred embodiment thereof, more particularly relates to a unique support module structure which carries both the expansion card and riser card portions of a desktop computer and may be removably plugged into a socket of the computer motherboard, thereby eliminating the conventional necessity of separately installing the expansion cards and riser card on, and separately removing them from the motherboard.

In one conventional construction thereof, desktop computers include an outer housing having a bottom wall on top of which the computer motherboard or system planar is horizontally mounted. To install expansion and riser cards within the housing it has heretofore been necessary to individually position each card over the motherboard and separately connect each card to the motherboard using appropriate cable connectors (or other individual connection apparatus) with the expansion cards in a horizontally stacked array and the riser card perpendicular to the motherboard, as well as installing a grounding connection for the expansion riser card. In another conventional desktop computer construction, the expansion cards are individually connected in vertical orientations to the motherboard without a separate riser card.

These installation techniques tend to be laborious and time-consuming, thereby undesirably increasing the overall fabrication cost associated with the computer. They also tend to adversely affect the serviceability and upgradeability of the computer since subsequent access to the motherboard requires that the expansion cards (and the riser card, if used) be individually disconnected and removed to gain access to the motherboard portion which they overlie. This disconnection of the expansion cards typically entails the laborious task of unscrewing each of the expansion cards from a housing structure, and disconnecting a variety of cables routed from the cards through the computer chassis to various connection points therein.

When servicing or upgrading of the motherboard is completed, the removed expansion cards must, of course, be individually reconnected to the motherboard. Typically, other internal computer components, such as cooling fans, are also individually connected to the motherboard and must be separately disconnected, to provide access to the motherboard portion which they overlie, and then reinstalled when the servicing or upgrading of the motherboard is completed.

It can readily be seen from the foregoing that it would be highly advantageous, from serviceability, upgradeability, and manufacturability standpoints, to provide improved apparatus, and associated methods, for removably mounting operating components such as expansion cards (and, if incorporated in the computer, an associated riser card) on a computer motherboard. It is accordingly an object of the present invention to provide such improved apparatus and methods.

SUMMARY OF THE INVENTION

From a broad perspective, the present invention provides apparatus for operatively and removably coupling a plurality of expansion cards to a connection socket on a computer motherboard without the previous necessity of separately connecting and disconnecting the cards from the motherboard. The apparatus comprises support means for removably supporting the plurality of expansion cards for conjoint movement therewith toward and away the motherboard, and coupling means carried by the support means and removably insertable in the motherboard socket to simultaneously connect the supported expansion cards to the motherboard.

In a preferred embodiment of the invention, the apparatus is an expansion card/riser card module in which a riser card is used as the coupling means for operatively connecting and disconnecting the supported expansion cards to and from the motherboard. The module includes a movable support structure that removably carries the riser card and the plurality of expansion cards for conjoint movement therewith. The riser card is operatively and removably coupled to the expansion cards and has a connection edge portion adapted to be removably received within the motherboard socket when the support structure is appropriately aligned over the socket and pushed against the motherboard.

Importantly, this simple movement of the module toward the motherboard simultaneously couples both the riser card and all of the expansion cards to the motherboard in a very rapid manner. Equally rapid disconnection of all of the cards from the motherboard is effected by simply pulling the module off the motherboard to disconnect the riser card from the motherboard socket. There is no need to unscrew any of the expansion cards, or individually disconnect cables associated therewith, to accomplish this disconnection.

The expansion card/riser card module thus advantageously eliminates the previous necessity of separately connecting and disconnecting the riser card and expansion card components to and from the motherboard, and accordingly facilitates the manufacturability, serviceability and upgradeability of the computer by simplifying the initial installation of the riser card and expansion cards, and providing much more rapid access to the motherboard when it becomes necessary to subsequently remove the cards therefrom.

According to various additional aspects of the present invention, several other unique features are preferably incorporated in the expansion card/riser card module. These features, which supplement the basic advantages present in the module, include (1) the removable snap-on attachment of an auxiliary cooling fan to the module support structure for movement therewith, the fan being operative to cool the interior of the module and operatively wired to the riser card; (2) the use of an end wall portion of the module support structure to define a portion of the rear end wall of the computer housing, the expansion card I/O port structure at the rear end of the computer housing, and the groove portion of a tongue-and-groove EMI joint; (3) the formation by the installed module of a bracing structure disposed within the computer housing and operative to bear a substantial portion of the weight of a monitor disposed on the top computer housing wall; and (4) the built-in provision of a grounding circuit for the riser card portion of the module.

The built-in grounding circuit for the riser card includes the expansion cards and metal strips attached thereto and in electrical contact with a layer of conductive copper paint on the interior surface of the module housing. The paint layer, in turn, extends into the aforementioned EMI joint, thereby grounding the riser card to the computer housing. An additional grounding path for the riser card is provided by a metal screw extended through a bottom side flange on the module housing, and an opening in the motherboard, into the base wall of the computer housing.

In an alternate embodiment of the module, ejection latch means are mounted on a side wall portion of the module support structure and are manually operable to exert a mechanically advantaged force on the motherboard to facilitate the removal of the riser card connection edge portion from the motherboard socket, a particularly useful feature when the socket is one requiring a high mating force. The ejection latch means representatively comprise an ejection lever pivotally connected at an inner end thereof to the support structure side wall portion. Anchored to the inner lever end is a cam member received in an opening of an ejection plate slidably carried on the support structure side wall portion for movement relative thereto toward and away from the motherboard. As the lever is manually pivoted toward a disconnect position thereof, the cam is driven against a surface of the plate opening in a manner driving the plate against the motherboard to thereby move the support structure away from the motherboard and forcibly withdraw the riser card connection edge portion from the motherboard socket.

DETAILED DESCRIPTION

Figure 1:
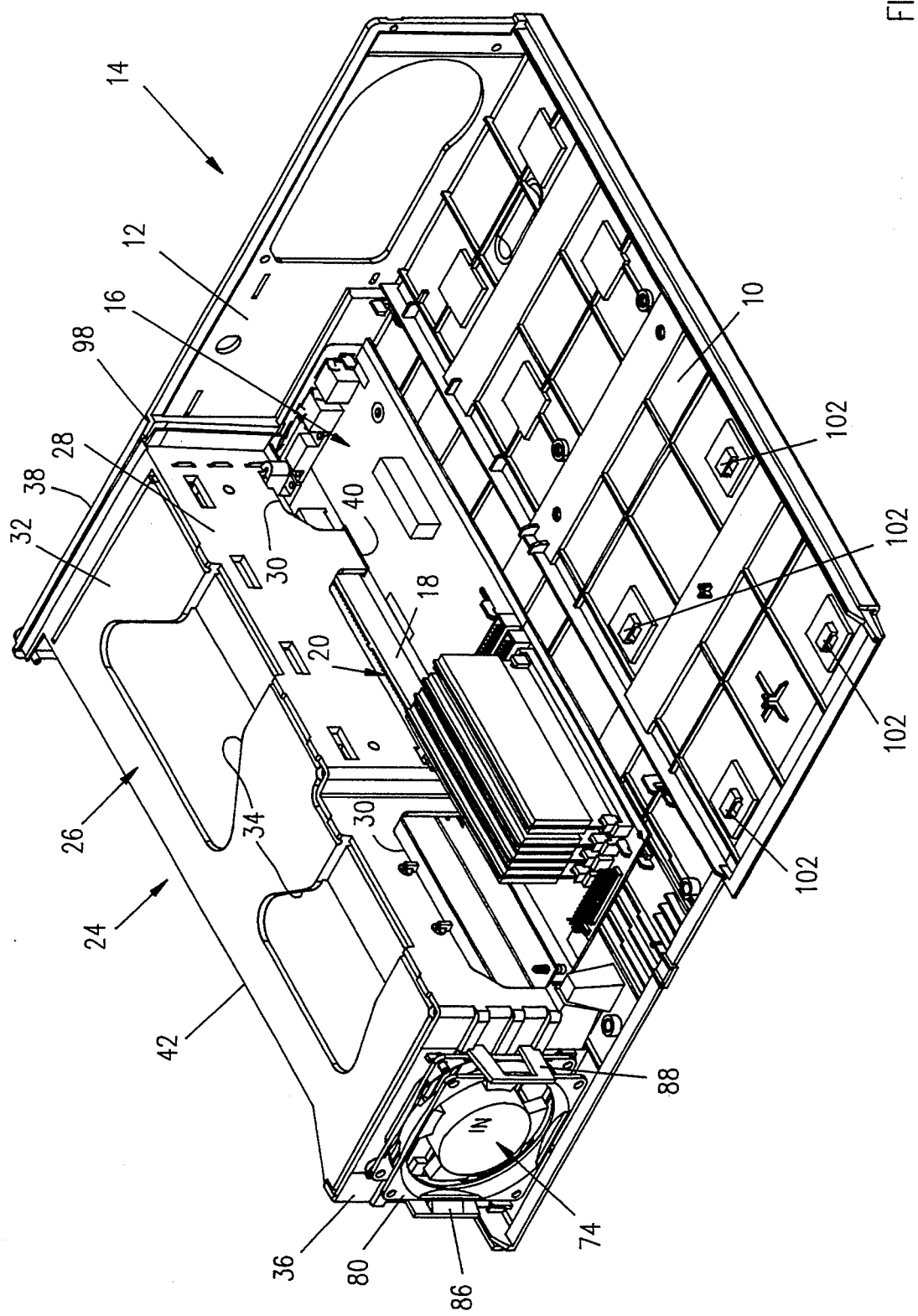
FIG. 1 is a perspective view of base and rear housing side wall portions of a representative desktop computer within which an expansion card/riser card module embodying principles of the present invention is operatively installed.
Figure 2:
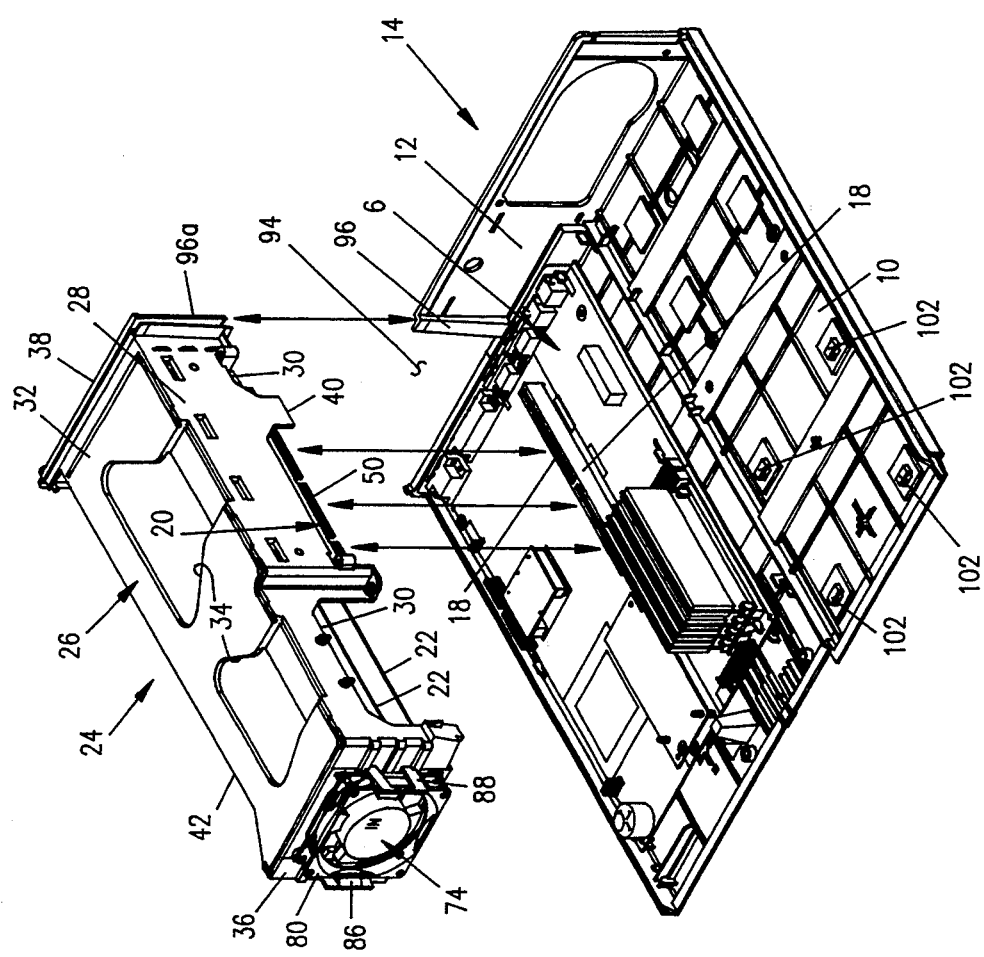
FIG. 2 is a partially exploded view of the computer in which the module has been upwardly removed from a mother board portion of the computer.

Perspectively illustrated in FIGS. 1 and 2 are bottom and rear end wall portions 10,12 of the generally rectangular outer housing of a representative desktop computer 14. To better illustrate certain interior components of the computer, the usual front end, opposite side and top walls of the computer housing have been removed. Mounted atop the bottom housing wall 10 is a main printed circuit board or "motherboard" 16 having, among other components thereon, an upwardly projecting rectangular electrical connection socket 18 elongated in a front-to-rear direction relative to the computer housing.

Other components operatively connected to the motherboard 16 include a riser card 20 (see FIG. 5), and a plurality of expansion cards 22 (see FIG. 7), representatively three in number. Under conventional computer construction practice, these card components of the overall computer operating system would be individually connected to the top side of the motherboard 16, typically with separate cable connectors, during the initial construction of the computer. Accordingly, subsequent access to the motherboard 16, for servicing or upgrading purposes, necessitated that the riser card and the expansion cards be removed one by one from the motherboard, and then separately and laboriously reconnected to the motherboard after the servicing or upgrading tasks were completed. This conventional card/motherboard connection technique, as may be readily imagined, appreciably increases both the manufacturing and servicing costs associated with the computer.

These conventional assembly and servicing limitations and disadvantages are substantially eliminated by the present invention via its unique incorporation in the illustrated computer 14 of a specially designed expansion card/riser card module 24. In a manner subsequently described, the module 24 supports the riser card 20 and the expansion cards 22 in an operably coupled relationship, and permits the cards 20,22 to be simultaneously disconnected from the motherboard socket 18 by simply lifting the module 24 upwardly therefrom, and then quickly reconnected to the motherboard by simply plugging the removed module 24 into the motherboard socket 18, in a manner that may generally seen by comparing FIGS. 1 and 2.

Referring generally now to FIGS. 1-7, the module 24 includes a support structure in the form of a generally rectangular housing portion 26 having (as viewed in FIGS. 1 and 2) an elongated front side wall 28 with ventilation openings 30 formed therein adjacent its bottom edge; an elongated top wall 32 with auxiliary cable routing openings 34 formed therein; a left end wall 36; a right end wall 38; an open bottom side 40; and an open rear side 42.

Figure 5:
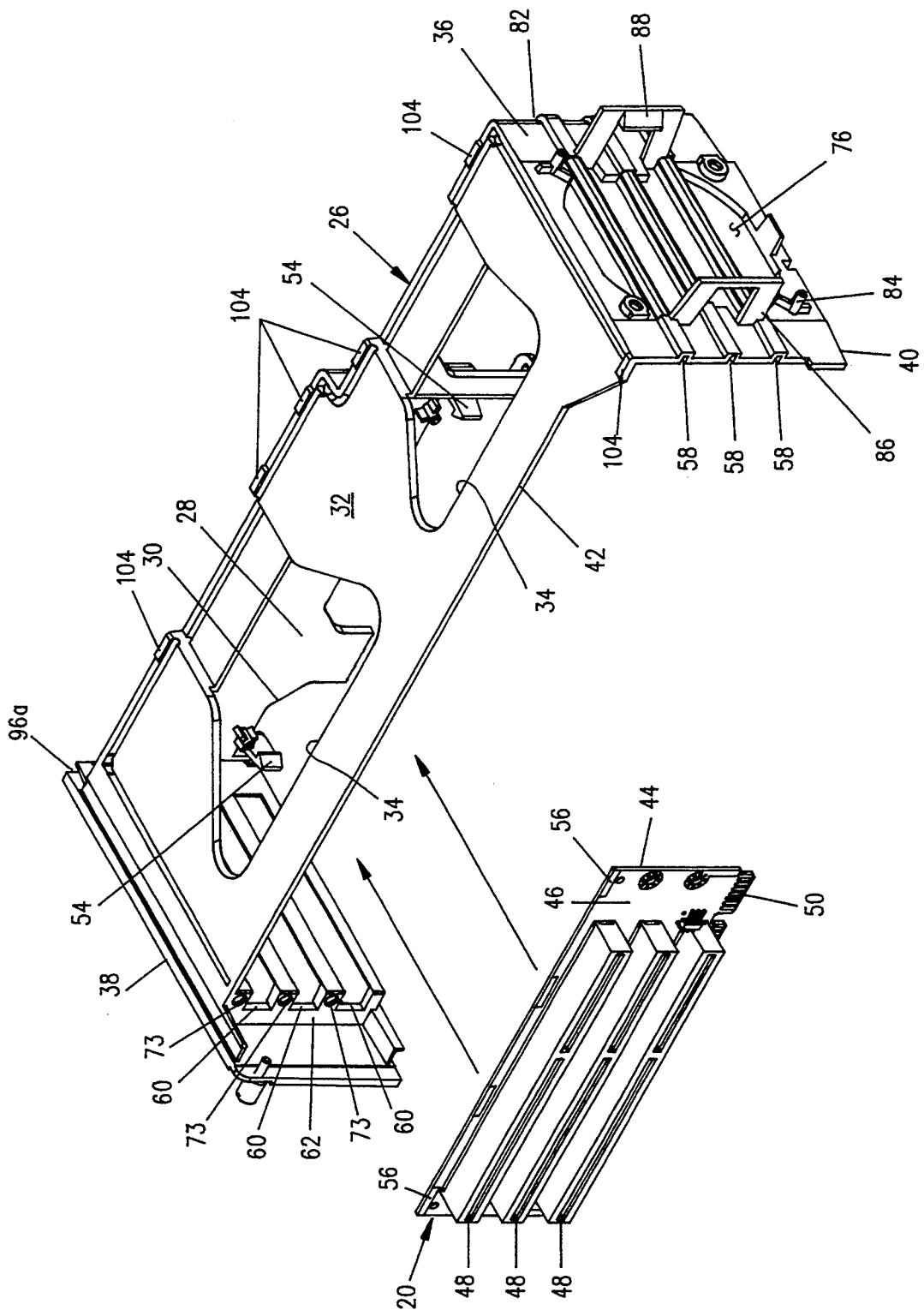
FIG. 5 is an enlarged scale, partially exploded left end and rear side perspective view of the module housing and a riser card removably supported thereon.

As best illustrated in FIGS. 2 and 5, the riser card 20 has a horizontally elongated rectangular body portion 44 from a rear side 46 of which a vertically spaced series of three horizontally elongated expansion card connection sockets 48 outwardly project. Projecting downwardly from the lower side edge of the riser card body 44 is a connector edge portion 50 which is configured to be removably and downwardly received in the motherboard socket 18 to electrically couple the riser card 20 to the motherboard.

The riser card 20, in the orientation thereof shown in FIG. 5, is removably snap-fitted onto the inner side of the module housing front wall 28 by means of a series of rearwardly projecting connection structures formed on the module housing front wall 28. As can be best seen in FIG. 6, these connection structures include a horizontally spaced series of four downwardly hooked retention members 51 positioned adjacent the top side edge of the front module housing wall 28; a pair of thin, generally rectangular guide members 52 disposed below the horizontally outermost pair of the retention members 51; and a pair of resilient clip members 54 positioned beneath the guide members 52 adjacent the bottom side edge of front module housing wall 28.

To removably connect the riser card 20 to the inner side of the front module housing side wall 28 a top edge portion of the card 20 is tipped forwardly and inserted under the retention members 51, with a pair of rectangular ground pads 56 in the card 20 (see FIG. 5) aligned with the guide members 52. The bottom side edge of the card 20 is then pushed forwardly to cause the guide members 52 to contact the ground pads 56 and the clip members 54 to snap outwardly over opposite end edge portions of the card 20. With the riser card 20 installed within the module housing 26 in this manner, the connection edge portion 50 of the card 20 is parallel to and spaced slightly inwardly from the front wall 28 of the module housing 26 as best illustrated in FIG. 2.

Figure 6:
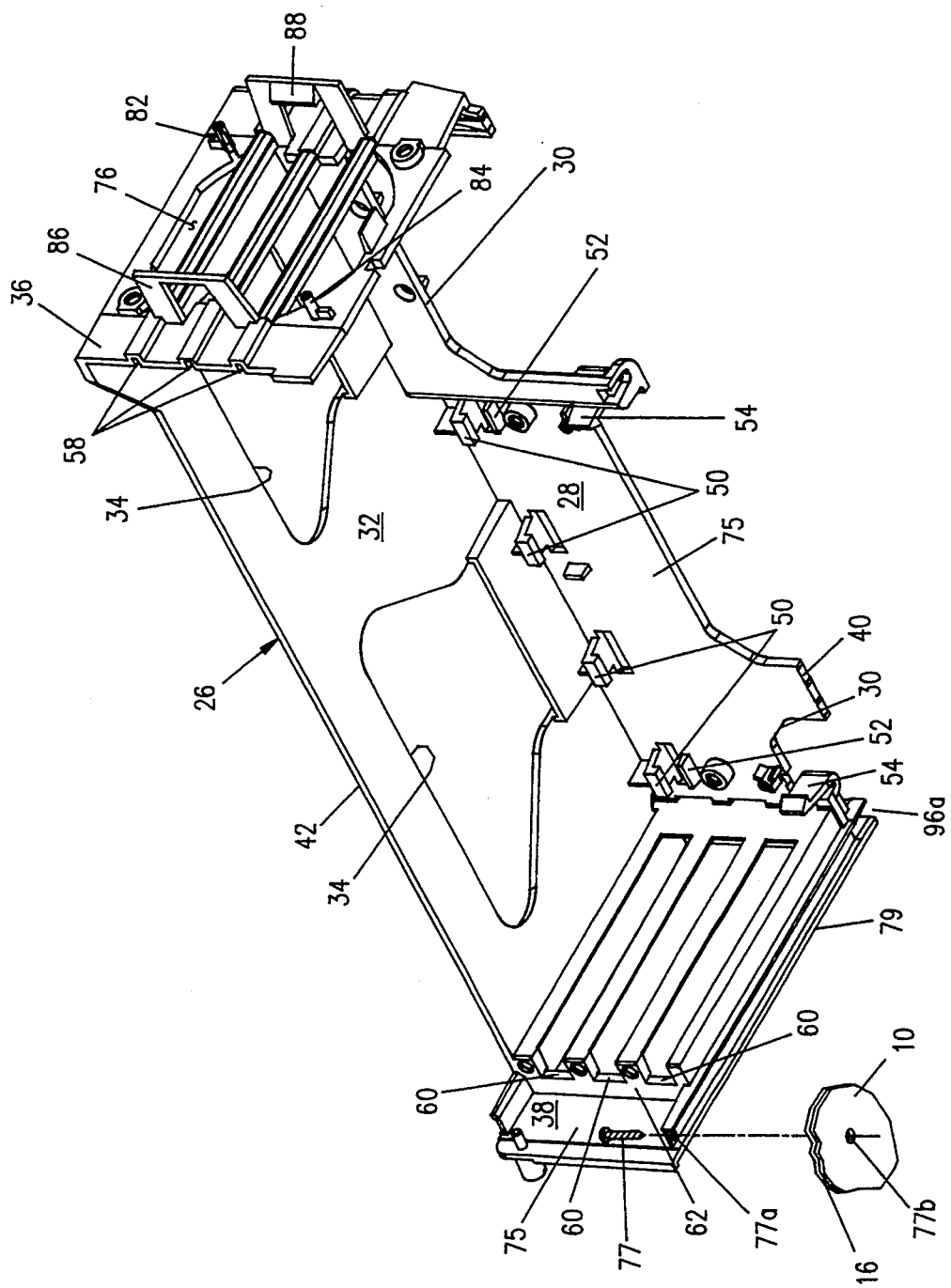
FIG. 6 is an enlarged scale bottom side perspective view of the housing.
Figure 7:
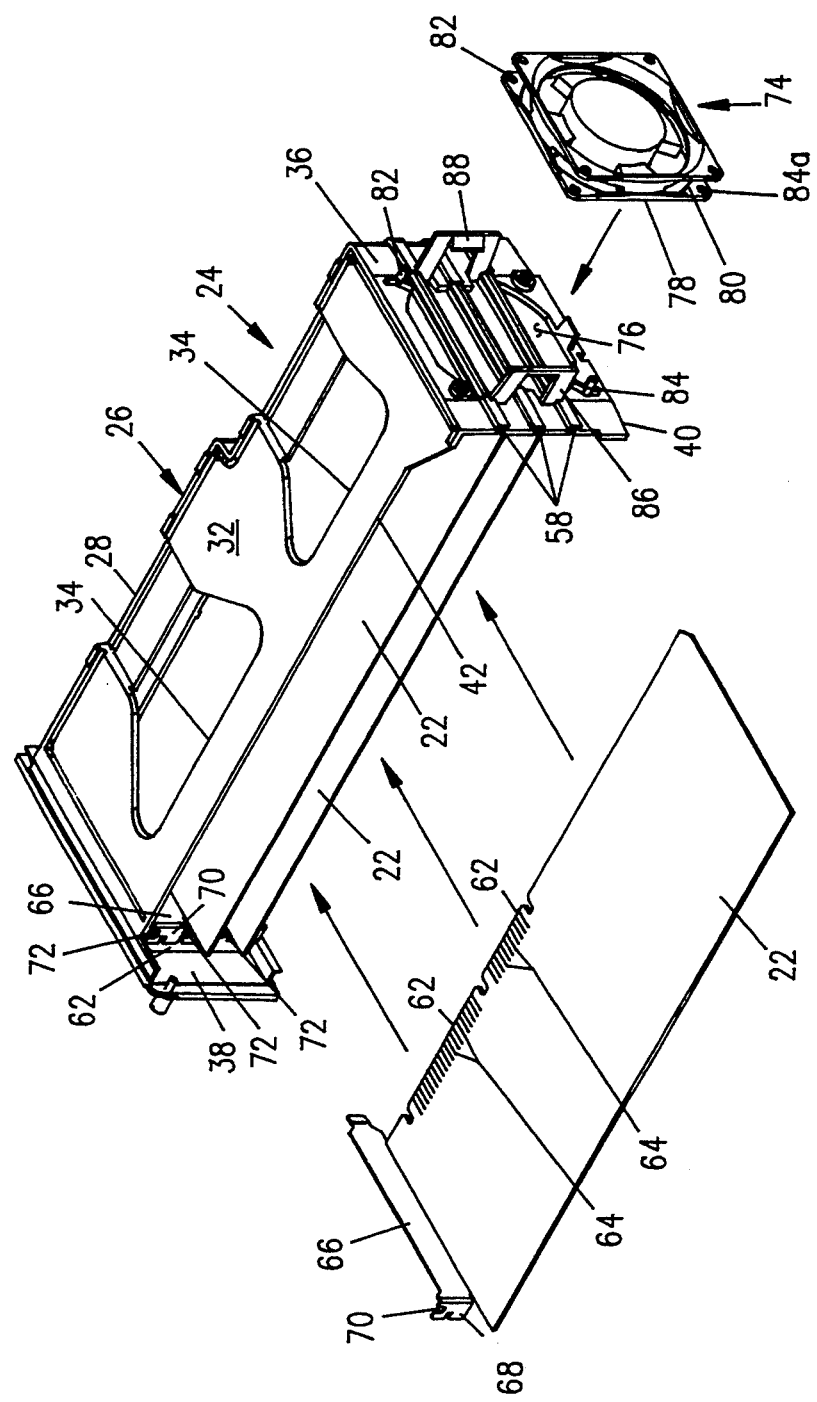
FIG. 7 is an enlarged scale, partially exploded left end and rear side perspective view of the module housing together with expansion cards and an auxiliary cooling fan removably supported thereon.

With reference now to FIGS. 5-7, a vertically spaced series of horizontally extending guide slots 58 are formed along the inner side surface of the left module housing end wall 36 and are aligned with three somewhat wider horizontal channels 60 formed in a thickened inner side portion 61 of the right module housing end wall 38. Each of the expansion cards 22 has a pair of front edge connection portions 62 with electrically conductive surface traces 64 formed thereon. Extending transversely along a left end edge portion 22a of each expansion card 22 (as viewed in FIG. 7) is a metal conductor/grounding strip 66 having an outwardly bent rear end portion 68 having an arcuate notch 70 formed in its top side edge.

Each of the three expansion cards 22 is removably installed within the module housing 26 by respectively inserting a right edge portion 22b of the card into one of the slots 58 and then sliding the card forwardly into the module housing 26, through its open rear side 42, until the connector edge portions 62 of the card enter and bottom out within one of the sockets 48 of the previously installed riser card 20 (see FIG. 5). When this occurs, the metal strip end portion 68 associated with the riser card 22 is brought into engagement with the left end surface of the thickened housing wall portion 61 as best illustrated in FIG. 7.

Screws 72 are then passed through the arcuate strip notches 70, and threaded into small circular openings 73 in the thickened wall portion 61 (see FIGS. 5 and 7), to captively retain the installed expansion cards 22 within the module housing 26, and thereby complete the supporting of each of the installed expansion cards 22 along three side edges thereof. The installed riser card 20 is grounded to the computer housing via the expansion cards 22, the metal strips 66, screws 72, and coats of electrically conductive paint 75 on the inner sides of module housing walls 28 and 38. To further ground the riser card to the computer housing, a metal grounding screw 77 is extended downwardly through an opening 77a in a coated mounting leg 79 (FIG. 3) and into the base computer housing wall 10 through an opening 77b in the motherboard 16.

Conveniently incorporated in the module 24 is an auxiliary cooling fan 74 (see FIG. 7) which is removably snap-fitted onto the left module housing end wall 36 over an air inlet opening 76 extending therethrough. To facilitate this snap fit engagement, the housing portion of the fan is provided with an opposed pair of rectangular flanges 78 and 80, and the module housing end wall 36 is provided with outwardly projecting, diagonally opposite alignment pins 82 and 84, and a horizontally opposed pair of resilient latch members 86 and 88.

Fan 74 is installed on the module housing end wall 36 by simply pushing the fan (in its FIG. 7 orientation) between the latch members 86,88 in a manner causing the pins 82,84 to enter corresponding circular holes 82a,84a in the fan housing flange 78, and the latch members 86,88 to snap outwardly over the fan housing flange 80 as shown in FIGS. 1 and 2. Power leads 90 connected to the fan 74 (see FIG. 3) are conveniently supported on outwardly projecting, upturned hook members 92 formed on the module housing front side wall 28. From these hook members, the leads 90 are routed into the module housing 26 where they are appropriately connected to the riser card 20 to receive power from the motherboard 16. During operation of the fan 74, cooling air is drawn into the interior of the module housing 26, via the various openings therein, and then discharged outwardly through the computer housing through suitable discharge openings therein (not shown).

The assembled expansion card/riser card module 24 may be very quickly and easily installed on the motherboard 16, in a manner operatively coupling the riser and expansion cards 20,22 thereto, simply by placing the module 24 above the motherboard 16 (as shown in FIG. 2) with the connector edge portion 50 of the riser card 20 aligned with the motherboard socket 18, and then pushing the module 24 down onto the motherboard to insert the card edge portion 50 into socket 18 as shown in FIG. 1.

The installed module 24, and thus the cards 20,22 and the cooling fan 74, may be later removed from the motherboard 16 simply by pulling the module 24 upwardly from its FIG. 1 position to its FIG. 2 position to unplug the riser card edge portion 50 from the motherboard socket 18. This simultaneous removal of the cards 20,22 and the cooling fan 74 from the motherboard 16 rapidly exposes a major underlying area thereof, for servicing or upgrading purposes, without the previous necessity of separately disconnecting these components from the motherboard and subsequently reconnecting them, one by one, to the motherboard.

In addition to supporting the riser card 20, the expansion cards 22, and the auxiliary cooling fan 24 for simultaneous plug-in installation on, and subsequent simultaneous removal from the motherboard 16, the module 24 uniquely incorporates therein several other desirable features that further facilitate the fabrication of the computer 14. For example, with reference now to FIGS. 1-3, it can be seen that the rear computer housing end wall 12 stops short of the left edge of the bottom computer housing wall 10 (as viewed in FIG. 2), thereby leaving a gap 94 at the rear end of the partially assembled computer housing.

A left end portion 96 of the rear computer housing end wall 12 is inwardly offset relative to the balance of the wall, and a complementarily configured vertical groove 96a is formed in an end edge portion of the right module housing end wall 38 adjacent the front module housing side wall 28. As the module 24 is downwardly moved from its FIG. 2 position to its FIG. 1 installed position, the inwardly offset end wall portion 96 upwardly enters the groove 96a.

When the module 24 is operatively plugged into the motherboard socket 18, the mated wall and groove portions 96,96a form a tongue-and-groove EMI joint 98 at the rear end of the computer housing, with the right module housing end wall 38 filling in the gap 94 and defining the remaining left end portion of the rear computer housing end wall. As best illustrated in FIG. 4, the right module housing end wall 38 is also configured to define the rear expansion card I/O section 100 of the computer 14.

Figure 9:
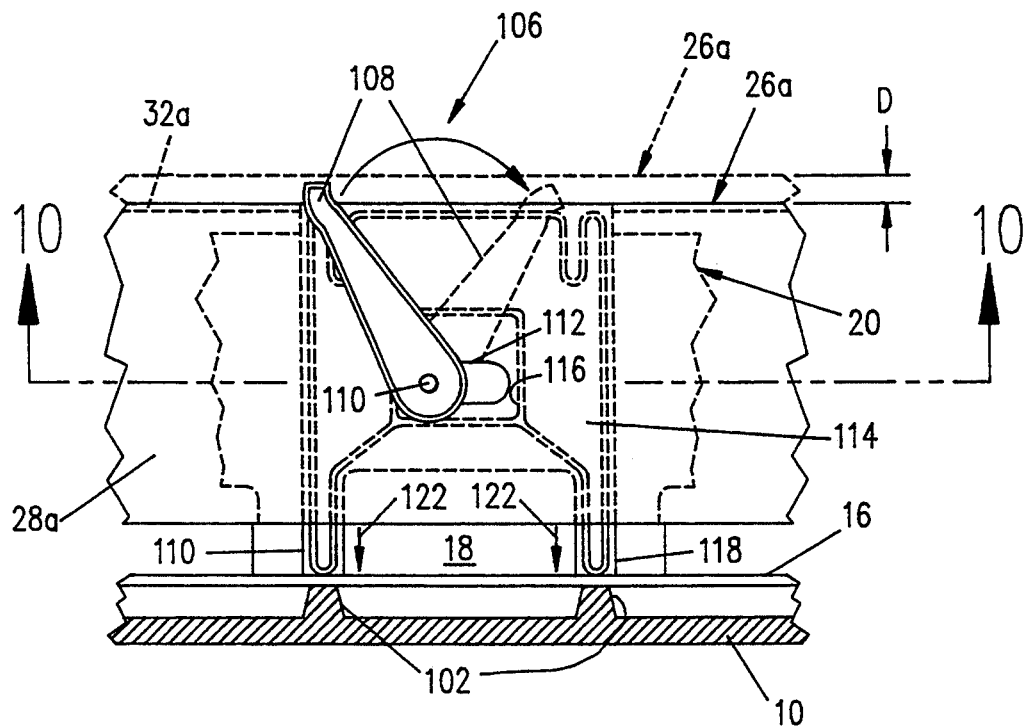
FIG. 9 is an enlarged scale, somewhat simplified front elevational view of a disconnection latch portion of the FIG. 8 module.

As illustrated in FIGS. 1 and 2, a spaced series of support bosses 102 project upwardly from the bottom computer housing wall 10, with some of these bosses (not visible in FIGS. 1 and 2) supportingly underlying the motherboard 16 as illustrated in FIG. 9. In accordance with an additional feature thereof, the installed module 24 serves as an internal bracing structure within the computer housing to facilitate the support of a monitor on the top wall of the computer housing.

Figure 3:
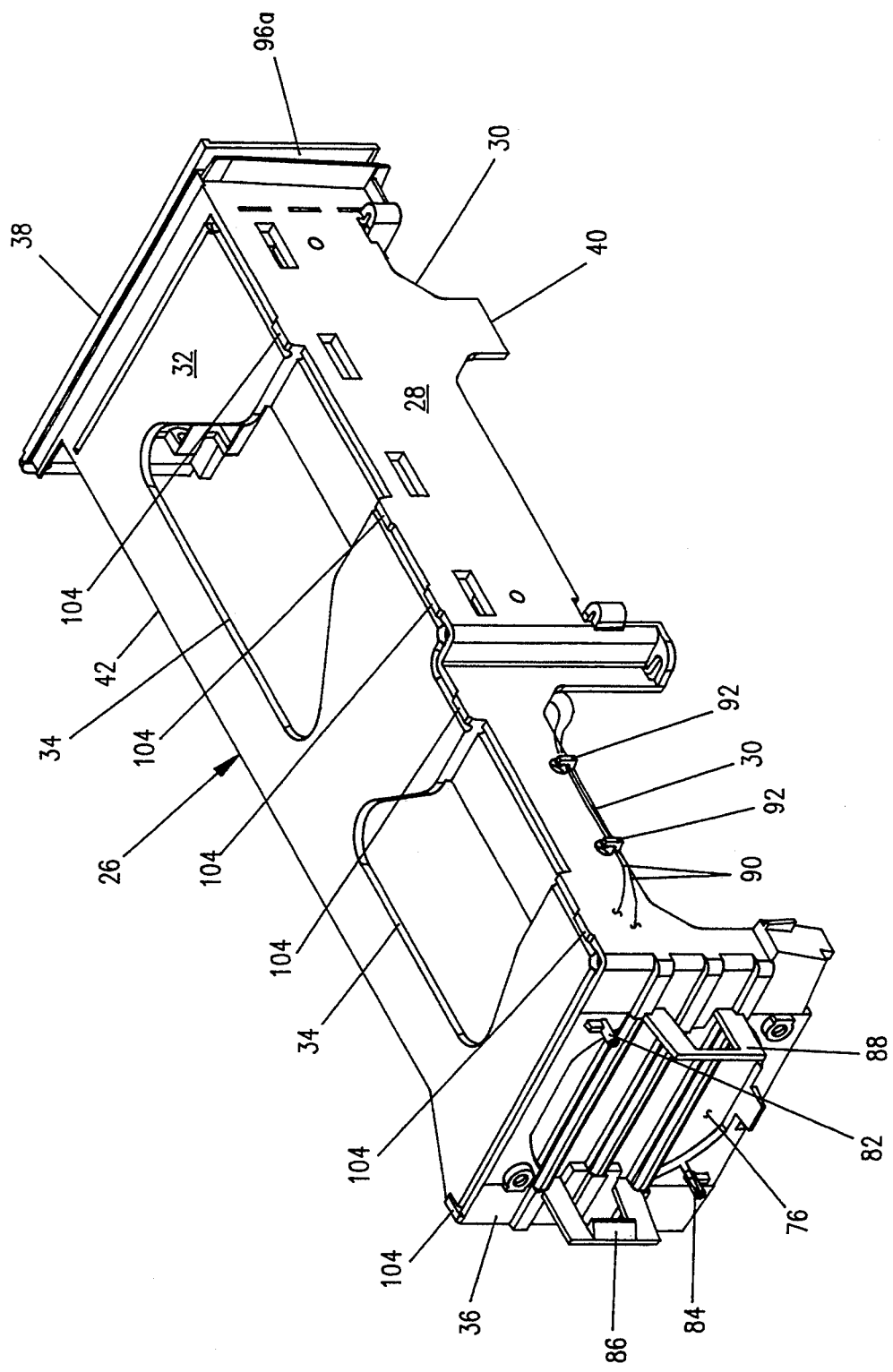
FIG. 3 is an enlarged scale left end and front side perspective view of a housing portion of the module.
Figure 4:
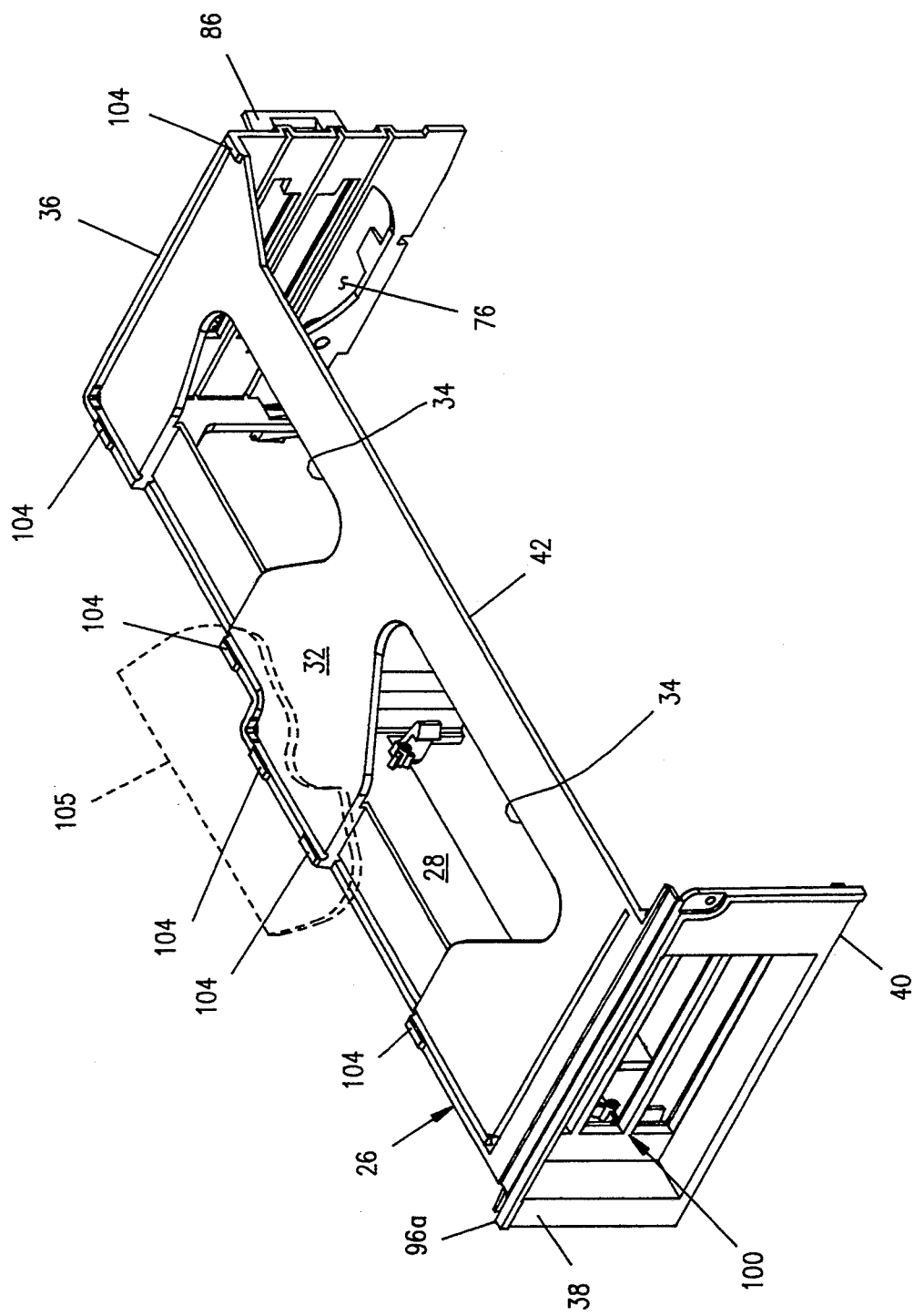
FIG. 4 is an enlarged scale right end and rear side perspective view of the module housing.

When the module 24 is operatively installed within the computer 14, bottom side edge portions of the module bear against the top side of the motherboard 16, and upwardly projecting support portions 104, spaced apart along the upper side edges of the module housing walls 28 and 36 as shown in FIGS. 3 and 4, bear against the underside of the installed top wall 105 of the computer housing. Accordingly the weight of a monitor resting on the top computer housing wall is transferred to the bottom computer housing wall 10 sequentially through the support portions 104, the module housing walls 28 and 36, the motherboard 16, and the support bosses 102 underlying the motherboard.

Figure 8:
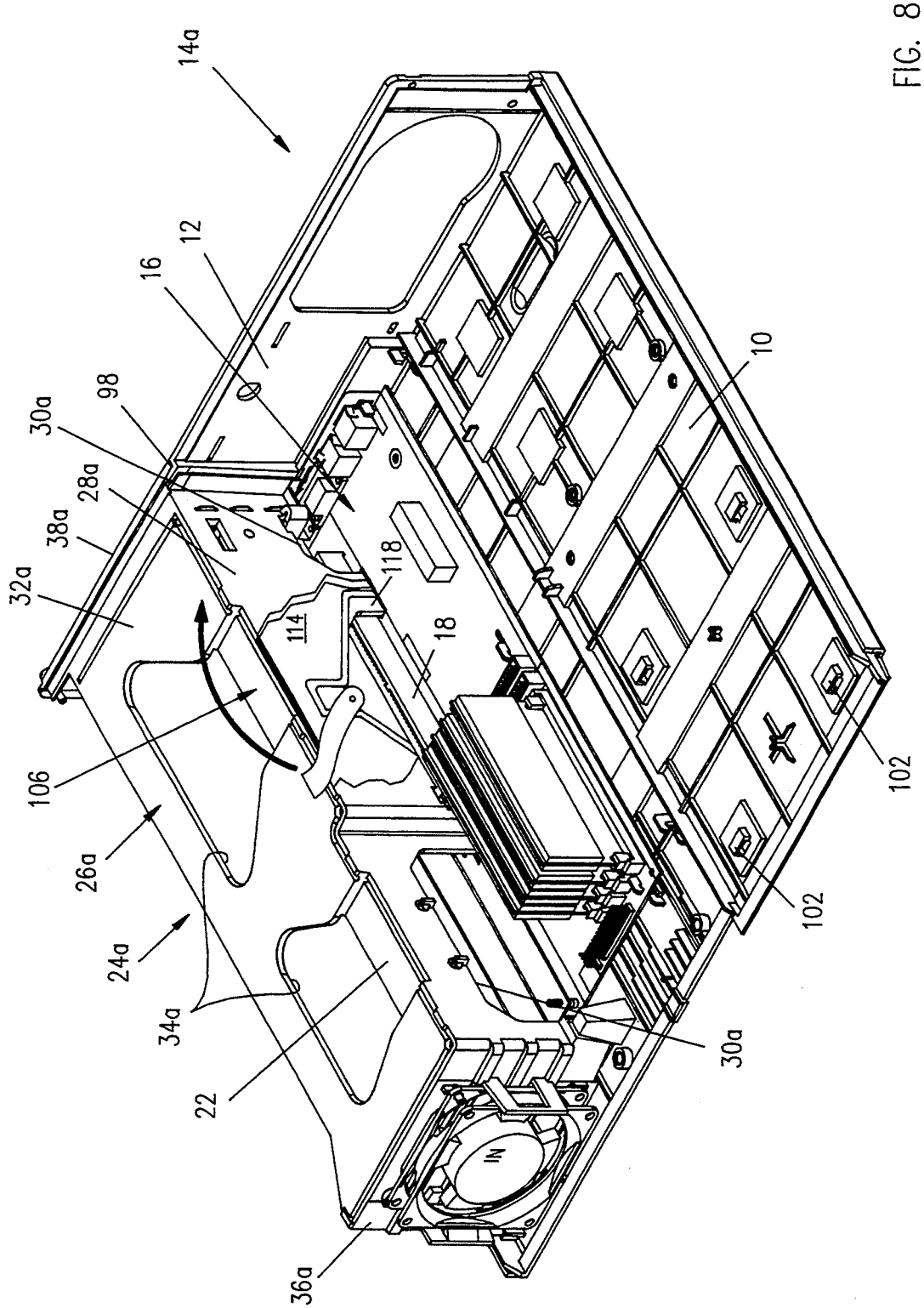
FIG. 8 is a reduced scale, partially cut away perspective view of the FIG. 1 computer with an alternate embodiment of the expansion card/riser card module operatively installed therein.

An alternate embodiment 14a of the previously described computer 14 is depicted in FIG. 8 and incorporates an alternate version 24a of the previously described expansion card/riser card module 24. With the exception of the difference noted below, the module 24a is identical to the module 24. To facilitate the comparison of the modules 24 and 24a, the components in module 24a similar to those in module 24 have been given the same reference numerals, but with the subscripts "a".

Figure 10:
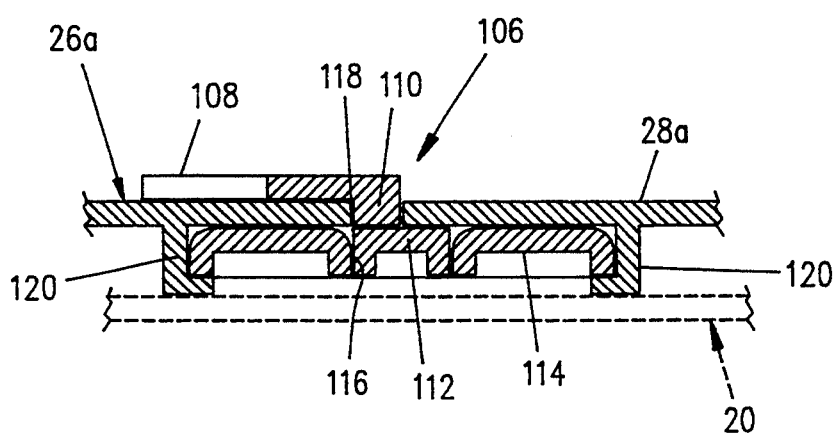
FIG. 10 is a partially phantomed, somewhat simplified cross-sectional view through the disconnection latch portion taken along line 10—10 of FIG. 9.

The module 24a is provided with a specially designed ejection structure 106 shown in FIGS. 8–10 and operative to facilitate the disconnection of the riser card connector edge portion 50 from the motherboard socket 18. This feature of the module 24a is particularly useful where a high disconnection force is required, such as when the socket 18 is a high mating force connector.

Ejection structure 106 includes an elongated ejection lever 108 having a transverse cylindrical boss 110 on an inner end portion thereof; a cam member 112 fixedly secured to the outer end of the boss 110; and an ejection plate 114 having a central rectangular opening 116 and a spaced pair of downwardly projecting leg portions 118. Boss 110 is rotatably received in, and extends inwardly through, a circular opening 118 in the front module housing side wall 28a, with the lever positioned on the outer side of wall 28a and the cam 112 positioned on the inner side of wall 28a and received in the plate opening 116.

Plate 114 is slidably carried on the inner side of the wall 28a, for vertical movement relative thereto, by a horizontally spaced pair of vertically elongated retaining members 120 formed on the wall 28a. As best illustrated in FIG. 10, the retaining members 120 have generally L-shaped cross sections along their lengths and wrap outwardly around opposite side edge portions of the plate 114.

With the riser card connection edge portion 50 operatively plugged into the motherboard socket 18 as previously described, the lever 108 is in its leftwardly pivoted solid line position shown in FIG. 9, and the bottom ends of the plate legs 110 engage the motherboard 16 directly over a pair of support bosses 102 which underlie the board. To forcibly disconnect the card edge portion 50 from the motherboard socket 18, using a mechanically advantaged force provided by the lever 108, the lever 108 is manually rotated approximately ninety degrees in a clockwise direction from its solid line position to its dotted line position.

The corresponding clockwise rotation of the cam 112 causes it to forcibly engage the bottom side of plate opening 116, thereby forcing the plate 114 downwardly relative to the module housing wall 28a (as indicated by the arrows 122 in FIG. 9) through a distance D generally equal to the insertion distance of the riser card connector edge portion 50 into the motherboard socket 18. The downward force exerted on the motherboard 16 by the bottom ends of the plate legs 110 resultingly acts to lift the module housing 26a the distance D away from the motherboard 16, thereby disconnecting the card edge portion 50 from the motherboard socket 18.

As can be readily seen from the foregoing, the expansion card/riser card modules 24 and 24a provide their associated computers with significant manufacturability, serviceability and upgradeability advantages over conventional computers in which the riser and expansion cards are separately connected to the motherboard. The other computer portions, such as the cooling fan, EMI joint structure, and the expansion card I/O port structure incorporated in the modules augment the advantages of the modules in these regards. While the modules 24 and 24a have been representatively illustrated as being incorporated in a desktop computer, it will be readily appreciated by those skilled in the computer fabrication art that they could also be advantageously utilized in other types of computers such as floor mounted computers.

The foregoing detailed description is to be clearly understood as being given by way of illustration and example only, the spirit and scope of the present invention being limited solely by the appended claims.

What is claimed is:

1. Apparatus for operatively and removably coupling a riser card and at least one expansion card to a printed circuit board disposed within the outer housing of a computer and having an electrical connection socket thereon, said apparatus comprising:

a movable support structure;

a riser card secured to said support structure for movement therewith, secured riser card having a connection edge portion oriented to be removably inserted into said socket in response to an installation movement of said support structure toward said socket, and a socket portion for removably receiving connection edge portions of a plurality of expansion cards; and means disposed on said support structure for removably supporting, for conjoint movement with the support structure and said riser card, a plurality of expansion cards having connection edge portions operably and removably received in said socket portion of said riser card; and ejection means carried by said support structure for movement relative thereto, said ejection means being manually operable to exert a mechanically advantaged force on the printed circuit board to move said support structure away from the printed circuit board in a manner forcibly withdrawing said riser board connection edge portion from the motherboard socket.

2. An expansion card/riser card module removably connectable to a motherboard of a computer, the motherboard having an electrical connection socket on one side thereof, said expansion card/riser card module comprising:

a module housing having a front side wall, a top wall, first and second opposite end walls having vertically spaced series of elongated, parallel indentations formed on inner side surfaces thereof and longitudinally extending in laterally opposing pairs toward said front side wall of said module housing, an open rear side, and a bottom side;

a riser card having a side edge portion removably insertable into the motherboard socket to operably couple said riser card to the motherboard, and an electrical connection socket portion positioned on a side thereof, said riser card being removably supported on said front module housing wall, for movement therewith, in a manner permitting said riser card connection edge portion to be inserted into the motherboard socket by moving said module housing, bottom side first, toward the socket side of the motherboard;

a spaced plurality of generally rectangular expansion cards disposed in said module housing for movement therewith, each expansion card having a pair of opposite edge portions removably supported on said opposite module housing end walls, and a front side edge connection portion removably plugged into said riser card electrical connection socket portion, whereby said riser and expansion card portions of said module may be simultaneously connected or removed from the computer motherboard; and an ejection structure carried by said front side wall of said module housing for movement relative thereto, said ejection structure being manually operable to exert a mechanically advantaged force on the motherboard to move said module housing away from the motherboard in a manner forcibly withdrawing said riser board connection edge portion from the motherboard socket, said ejection structure including:

an ejection lever having an inner end pivotally connected to said front side wall of said module housing, an ejection plate slidably carried by said front side wall of said module housing for movement relative thereto into forcible engagement with the motherboard when said expansion card/riser card module is operatively positioned thereon, said ejection plate having a central opening therein, and a cam member secured to said inner end of said ejection lever for driven pivotal movement therewith relative to said front side wall of said module housing, said cam member being received in said central ejection plate opening and operative, in response to manual pivoting of said ejection lever, to engage a surface of said central opening and drive said ejection plate into forcible engagement with the motherboard.

3. An expansion card/riser card module removably connectable to a motherboard of a computer, the motherboard having an electrical connection socket on one side thereof, said expansion card/riser card module comprising:

a module housing having a top wall, a front side wall depending from said top wall, first and second opposite end walls depending from said top wall and extending generally perpendicularly to said front side wall, an open rear side, and a bottom side;

a riser card having a connection edge portion removably insertable into the motherboard socket to operably couple said riser card to the motherboard, and an electrical connection socket portion positioned on a side thereof, said riser card being removably supported on said module housing front side wall, for movement therewith, in a manner permitting said riser card connection edge portion to be inserted into the motherboard socket by moving said module housing, bottom side first, toward the socket side of the motherboard; and at least one generally rectangular expansion card disposed within said module housing for movement therewith and being insertable into and removable from the interior of said module housing through said open rear side thereof, each expansion card being generally transverse to said front side wall of said module housing and having opposite first and second side edge portions respectively and removably supported on said first and second opposite end walls of said module housing, and a third side edge portion disposed between said opposite first and second edge portions and being removably plugged into and supported by said riser card electrical connection socket portion, whereby said riser and expansion card portions of said module may be simultaneously connected to or disconnected from the motherboard by moving said module housing toward and away from the socket side of said motherboard, and each of said expansion cards is supported along three of its four side edges within said module housing.

4. The expansion card/riser card module of claim 3 wherein:

said riser card is removably snap-fitted onto the inner side of said front side wall of said module housing.

5. The expansion card/riser card module of claim 3 wherein:

one of said first and second opposite end walls of said module housing is configured to define an external I/O port structure for said at least one expansion card.

6. The expansion card/riser card module of claim 3 wherein:

said computer has an outer housing with a rear end wall portion, and one of said first and second opposite end walls of said module housing is configured to cooperatively define with said outer housing rear end wall portion a tongue-and-groove EMI joint, and to form an extension of said rear end wall portion that is contiguous with a side wall portion of said outer computer housing.

7. The expansion card/riser card module of claim 3 further comprising:

a cooling fan operative to flow cooling air through said module housing, said cooling fan being removably and operatively mounted on one of said first and second end walls of said module housing for movement with said module housing.

8. The expansion card/riser card module of claim 7 wherein:

said cooling fan is removably snap-fitted onto said one of said first and second end walls of said module housing.

9. The expansion card/riser card module of claim 7 wherein:

said cooling fan is wired to said riser card to receive electrical power therethrough from said motherboard.

10. The expansion card/riser card module of claim 3 wherein:

the computer has an outer housing with a base wall portion upon which a first side of the motherboard rests, and a top wall spaced upwardly apart from and generally parallel to the second side of the motherboard, and said module housing is configured to extend between said second side of the motherboard and said top wall of said outer computer housing and brace a substantial portion of said top wall of said outer computer housing, in a manner substantially isolating said riser card from downward loads borne by said top wall of said outer computer housing, by transferring downward loads received by said top module housing wall from said top wall of said outer computer housing to the motherboard through said front side wall and opposite first and second end walls of said module housing.

11. The expansion card/riser card module of claim 3 wherein:

each of said at least one expansion card has a metal strip secured thereto and engaging one of said first and second end walls of said module housing, and each expansion card and its associated metal strip combinatively define a portion of a grounding circuit for said riser card.

12. The expansion card/riser card module of claim 11 wherein said grounding circuit further comprises a layer of electrically conductive paint disposed on an interior surface portion of said module housing.

13. The expansion card/riser card module of claim 12 wherein:

the computer has an outer housing with a base wall portion upon which the motherboard rests, and said grounding circuit further comprises a metal grounding screw extendable through a portion of said module housing and into the computer housing base wall through the motherboard.

14. A computer comprising:

a computer housing having vertically spaced apart, generally parallel upper and lower side walls;

a motherboard supported on said lower side wall and having a top side upon which an electrical connection socket is operatively disposed;

a module housing disposed within said computer housing, said module housing having a top wall, a front side wall depending from said top wall, first and second opposite end walls depending from said top wall and extending generally perpendicularly to said front side wall, an open rear side, and a bottom side;

a riser card having a connection edge portion removably inserted into said motherboard socket and operably coupling said riser card to said motherboard, and an electrical connection socket portion positioned on a side thereof, said riser card being removably supported on said module housing front side wall, for movement therewith, in a manner permitting said riser card connection edge portion to be inserted into the motherboard socket by moving said module housing, bottom side first, toward the socket side of the motherboard; and at least one generally rectangular expansion card disposed within said module housing for movement therewith and being insertable into and removable from the interior of said module housing through said open rear side thereof, each expansion card being generally transverse to said front side wall of said module housing and having opposite first and second side edge portions respectively and removably supported on said first and second opposite end walls of said module housing, and a third side edge portion disposed between said opposite first and second edge portions and being removably plugged into and supported by said riser card electrical connection socket portion, whereby said riser and expansion card portions of said module may be simultaneously connected to or removed from said motherboard by moving said module housing toward and away from said connection socket on said motherboard, and each of said expansion cards is supported along three of its four side edges within said module housing.

15. The computer of claim 14 wherein:

said riser card is removably snap-fitted onto the inner side of said front side wall of said module housing.

16. The computer of claim 14 wherein:

one of said first and second opposite end walls of said module housing is configured to define an external I/O port structure for said at least one expansion card.

17. The computer of claim 14 wherein:

said computer housing has a vertically extending rear end wall portion, and one of said first and second opposite end walls of said module housing defines with said computer housing rear end wall portion a tongue-and-groove EMI joint, and further forms an extension of said rear end wall portion that is contiguous with a vertically extending side wall portion of said computer housing.

18. The computer of claim 14 further comprising:

a cooling fan operative to flow cooling air through said module housing, said cooling fan being removably and operatively mounted on one of said first and second end walls of said module housing for movement with said module housing.

19. The computer of claim 18 wherein:

said cooling fan is removably snap-fitted onto said one of said first and second end walls of said module housing.

20. The computer of claim 18 wherein:

said cooling fan is directly wired to said riser card to receive electrical power therethrough from said motherboard.

21. The expansion card/riser card module of claim 14 wherein:

said module housing is configured to extend between said top side of the motherboard and said upper side wall of said outer computer housing and brace a substantial portion of said upper side wall of said outer computer housing, in a manner substantially isolating said riser card from downward loads borne by said upper side wall of said computer housing, by transferring downward loads received by said top module housing wall from said upper side wall of said computer housing to the motherboard through said front side wall and opposite first and second end walls of said module housing.

22. The computer of claim 14 wherein:

each expansion card has a metal strip secured thereto and engaging one of said first and second end walls of said module housing, and each expansion card and its associated metal strip combinatively define a portion of a grounding circuit for said riser card.

23. The computer of claim 22 wherein said grounding circuit further comprises a layer of electrically conductive paint disposed on an interior surface portion of said module housing.

24. The computer of claim 12 wherein:

said grounding circuit further comprises a metal grounding screw extending through a portion of said module housing and into the computer housing lower side wall through said motherboard.

* * * * *